US010003343B2

(12) United States Patent
Kianush et al.

(10) Patent No.: US 10,003,343 B2
(45) Date of Patent: Jun. 19, 2018

(54) PHASE LOCKED LOOP CIRCUITS

(71) Applicant: NXP B.V.

(72) Inventors: Kaveh Kianush, Eindhoven (NL);
Evert-Jan Pol, SonenBreugel (NL);
Marcel Van De Gevel, Haarlem (NL)

(73) Assignee: NXP B.V., Eindhoven (NL)

( * ) Notice: Subject to any disclaimer, the term of this patent is extended or adjusted under 35 U.S.C. 154(b) by 0 days. days.

(21) Appl. No.: 15/404,059

(22) Filed: Jan. 11, 2017

(65) Prior Publication Data
US 2017/0214407 A1 Jul. 27, 2017

(30) Foreign Application Priority Data

Jan. 25, 2016 (EP) .................................... 16152608

(51) Int. Cl.
*H03L 7/089* (2006.01)
*H04L 7/033* (2006.01)
*H03L 7/099* (2006.01)
*H03L 7/08* (2006.01)

(52) U.S. Cl.
CPC ............ *H03L 7/089* (2013.01); *H03L 7/0807* (2013.01); *H03L 7/099* (2013.01); *H04L 7/0331* (2013.01)

(58) Field of Classification Search
CPC ....... H03L 7/0807; H03L 7/089; H03L 7/099; H03L 7/087; H04L 7/0331; H04L 7/033
See application file for complete search history.

(56) References Cited

U.S. PATENT DOCUMENTS

| 5,770,976 A * | 6/1998 | Nagaraj | H03D 13/004 327/12 |
| 6,411,144 B1 * | 6/2002 | Matsuno | H03L 7/0891 327/157 |
| 9,450,592 B2 * | 9/2016 | Maheshwari | H03L 7/0893 |

(Continued)

FOREIGN PATENT DOCUMENTS

| EP | 2 779 459 A1 | 9/2014 |
| GB | 2 260 454 A | 4/1993 |

OTHER PUBLICATIONS

Extended European Search Report for Patent Appln. No. 16152608.2 (Jul. 15, 2016).

(Continued)

*Primary Examiner* — Sophia Vlahos
(74) *Attorney, Agent, or Firm* — Rajeev Madnawat

(57) ABSTRACT

A phase locked loop circuit comprising: a phase detector configured to compare the phase of an input signal with the phase of a feedback signal in order to provide an up-phase signal and a down-phase-signal; an oscillator-driver configured to: apply an up-weighting-value to the up-phase signal in order to provide a weighted-up-phase signal; apply a down-weighting-value to the down-phase signal in order to provide a weighted-down-phase signal; and combine the weighted-up-phase signal with the weighted-down-phase signal in order to provide an oscillator-driver-output-signal; and a controller configured to: set the up-weighting-value and the down-phase-weighting as a first-set-of-unequal-weighting-values, and replace the first-set-of-unequal-weighting-values with a second-set-of-unequal-weighting-values if an operating signal of the phase locked loop circuit reaches a limit-value without satisfying a threshold value.

16 Claims, 6 Drawing Sheets

(56) References Cited

U.S. PATENT DOCUMENTS

| | | | |
|---|---|---|---|
| 9,490,824 B1* | 11/2016 | Singh | H03L 7/0891 |
| 2004/0135640 A1* | 7/2004 | Maneatis | G05F 3/262 |
| | | | 331/16 |
| 2004/0239354 A1* | 12/2004 | Knoll | H03L 7/0893 |
| | | | 324/76.53 |
| 2007/0132490 A1* | 6/2007 | Robinson | H03L 7/0893 |
| | | | 327/156 |
| 2009/0122939 A1* | 5/2009 | Hoang | H03K 19/17732 |
| | | | 375/375 |
| 2009/0128242 A1* | 5/2009 | Fitzgibbon | H03L 7/0898 |
| | | | 331/17 |
| 2009/0278614 A1* | 11/2009 | Dosho | H03L 7/0898 |
| | | | 331/17 |
| 2010/0171535 A1* | 7/2010 | Shanan | H03L 7/0893 |
| | | | 327/157 |
| 2014/0333346 A1 | 11/2014 | Bae et al. | |
| 2016/0191138 A1 | 6/2016 | Kianush et al. | |
| 2016/0211855 A1* | 7/2016 | Unruh | H03L 7/1974 |

OTHER PUBLICATIONS

Forcan, M. et al. "Concept Creation and Design of a Parameterizable, fast-locking 65 nm CMOS CDR-PLL for Gigabit Serial Chip-to-Chip Communication in Mobile Devices", 34 pgs. (Oct. 6, 2015).

\* cited by examiner

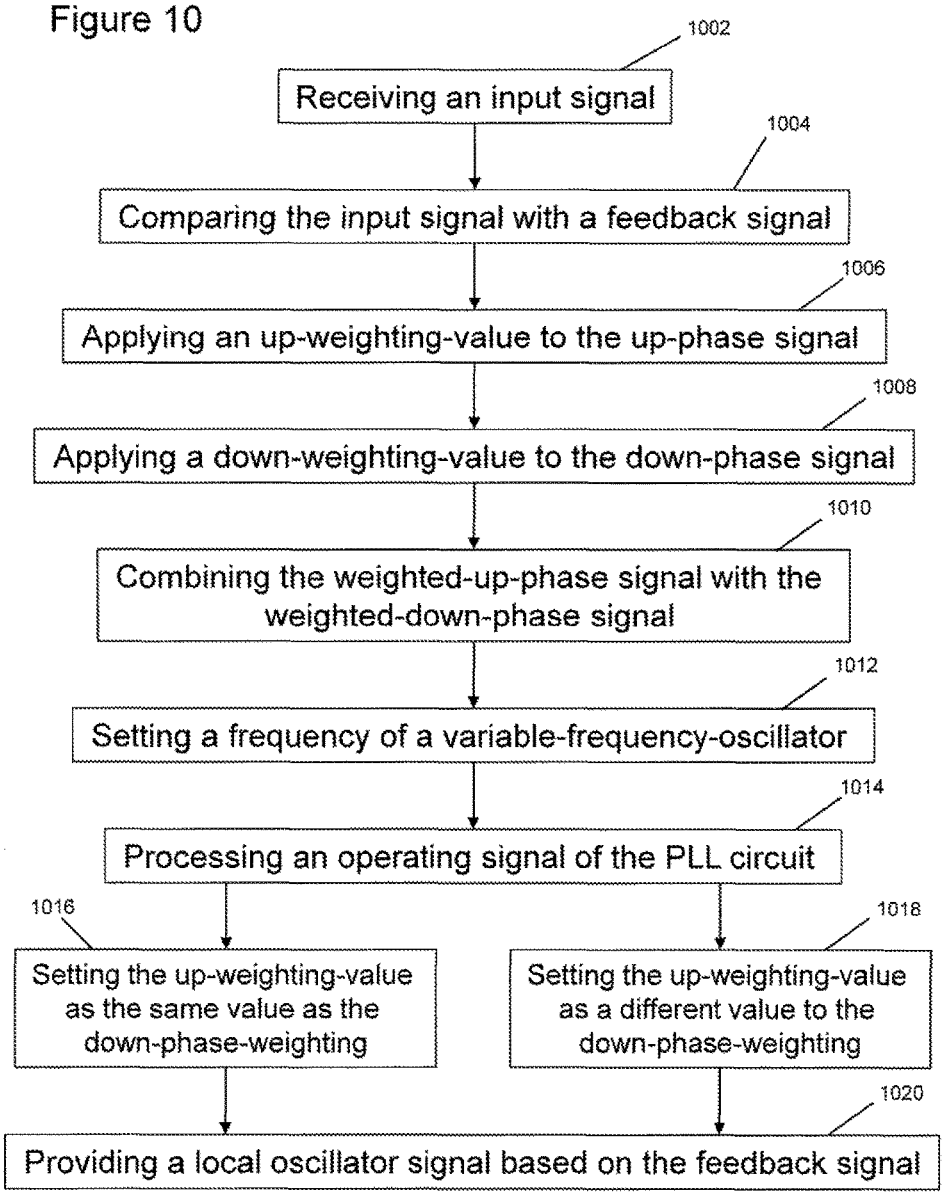

PHASE LOCKED LOOP CIRCUITS

CROSS-REFERENCE TO RELATED APPLICATIONS

This application claims the priority under 35 U.S.C. § 119 of European Patent application no. 16152608.2, filed on Jan. 25, 2016, the contents of which are incorporated by reference herein.

The present disclosure relates to phase locked loop circuits, and in particular, although not exclusively, to phase locked loop circuits for clock recovery circuits in radio receivers that apply phase diversity algorithms.

According to a first aspect of the present disclosure there is provided a phase locked loop circuit comprising:
  an input terminal configured to receive an input signal;
  a phase detector configured to compare the phase of the input signal with the phase of a feedback signal in order to provide an up-phase signal and a down-phase-signal, wherein the difference between (i) a property of the up-phase signal; and (ii) a property of the down-phase-signal, is indicative of a phase difference between the input signal and the feedback signal;
  an oscillator-driver configured to:
    apply an up-weighting-value to the up-phase signal in order to provide a weighted-up-phase signal;
    apply a down-weighting-value to the down-phase signal in order to provide a weighted-down-phase signal; and
    combine the weighted-up-phase signal with the weighted-down-phase signal in order to provide an oscillator-driver-output-signal;
  a variable-frequency-oscillator configured to provide the feedback signal for the phase detector, wherein the variable-frequency-oscillator is configured to set the frequency of the feedback signal based on the oscillator-driver-output-signal;
  a controller configured to:
    set the up-weighting-value and the down-phase-weighting as a first-set-of-unequal-weighting-values, and
    replace the first-set-of-unequal-weighting-values with a second-set-of-unequal-weighting-values if an operating signal of the phase locked loop circuit reaches a limit-value without satisfying a threshold value; and
  an output terminal configured to provide a local oscillator signal based on the feedback signal.

In one or more embodiments the controller is configured to:
  process an operating signal of the phase locked loop circuit to determine whether or not the input signal is in phase with the feedback signal, and
  if the input signal is in phase with the feedback signal, then set the up-weighting-value as the same value as the down-phase-weighting; and
  if the input signal is not in phase with the feedback signal, then set the up-weighting-value as a different value to the down-phase-weighting.

In one or more embodiments the oscillator-driver is configured to:
  multiply the up-phase signal by the up-weighting-value in order to provide the weighted-up-phase signal; and
  multiply the down-phase signal by the down-weighting-value in order to provide the weighted-down-phase signal.

In one or more embodiments, following a transition in the input signal, the phase detector is configured to compare the phase of the input signal with the phase of the feedback signal in order to provide the up-phase signal and down-phase-signal.

In one or more embodiments the phase detector is configured to compare the phase of the input signal with the phase of the feedback signal following only a rising-edge transition or only a falling-edge transition in the input signal.

In one or more embodiments the phase detector is configured to provide a pulse in the up-phase-signal in response to a transition in the input signal. The phase detector may be configured to provide a pulse in the down-phase-signal after the pulse in the up-phase-signal. The difference between (i) the duration of the pulse in the up-phase signal; and (ii) the duration of the pulse in the down-phase-signal, may be indicative of a phase difference between the input signal and the feedback signal. The duration of one of the pulses in the up-phase signal and the down-phase-signal may be indicative of clock frequency.

In one or more embodiments the phase detector is configured to set the duration of the pulse in the up-phase signal as equal to the duration of the pulse in the down-phase-signal when the input signal is in phase with the feedback signal.

In one or more embodiments the oscillator-driver is configured to determine an average value of the weighted-up-phase signal and the weighted-down-phase signal in order to provide the oscillator-driver-output-signal.

In one or more embodiments the controller is configured to compare the operating signal to a threshold value in order to determine whether or not the input signal is in phase with the feedback signal.

In one or more embodiments the first-set-of-unequal-weighting-values defines a first relative relationship between the up-weighting-value and the down-weighting-value, and the second-set-of-unequal-weighting-values defines a second, different relative relationship between the up-weighting-value and the down-weighting-value.

In one or more embodiments the first-set-of-unequal-weighting-values defines a first relative relationship between the up-weighting-value and the down-weighting-value, and the second-set-of-unequal-weighting-values defines the same relative relationship between the up-weighting-value and the down-weighting-value. The controller may be configured to reset the oscillator-driver-output-signal before replacing the first-set-of-unequal-weighting-values with the second-set-of-unequal-weighting-values.

There may be provided a radio tuner comprising a clock recovery circuit, wherein the clock recovery circuit includes any phase locked loop circuit disclosed herein.

There may be provided a method of operating a phase locked loop circuit, the phase locked loop comprising a variable-frequency-oscillator, wherein the method comprises:
  receiving an input signal;
  comparing the phase of the input signal with the phase of a feedback signal in order to provide an up-phase signal and a down-phase-signal, wherein the difference between (i) a property of the up-phase signal: and (ii) a property of the down-phase-signal, is indicative of a phase difference between the input signal and the feedback signal;
  applying an up-weighting-value to the up-phase signal in order to provide a weighted-up-phase signal;

applying a down-weighting-value to the down-phase signal in order to provide a weighted-down-phase signal; and combining the weighted-up-phase signal with the weighted-down-phase signal in order to provide an oscillator-driver-output-signal;

setting a frequency of a variable-frequency-oscillator based on the oscillator-driver-output-signal, wherein the variable-frequency-oscillator provides the feedback signal;

setting the up-weighting-value and the down-phase-weighting as a first-set-of-unequal-weighting-values, replacing the first-set-of-unequal-weighting-values with a second-set-of-unequal-weighting-values if an operating signal of the phase locked loop circuit reaches a limit-value without satisfying a threshold value; and providing a local oscillator signal based on the feedback signal.

There may be provided a phase locked loop circuit comprising:

an input terminal configured to receive an input signal;

a phase detector configured to compare the phase of the input signal with the phase of a feedback signal in order to provide an up-phase signal and a down-phase-signal, wherein the difference between (i) a property of the up-phase signal; and (ii) a property of the down-phase-signal, is indicative of a phase difference between the input signal and the feedback signal;

an oscillator-driver configured to;
  apply an up-weighting-value to the up-phase signal in order to provide a weighted-up-phase signal;
  apply a down-weighting-value to the down-phase signal in order to provide a weighted-down-phase signal; and
  combine the weighted-up-phase signal with the weighted-down-phase signal in order to provide an oscillator-driver-output-signal;

a variable-frequency-oscillator configured to provide the feedback signal for the phase detector, wherein the variable-frequency-oscillator is configured to set the frequency of the feedback signal based on the oscillator-driver-output-signal;

a controller configured to set the up-weighting-value as a different value to the down-phase-weighting; and an output terminal configured to provide a local oscillator signal based on the feedback signal.

There may be provided a phase locked loop circuit comprising:

an input terminal configured to receive an input signal;

a phase detector configured to compare the phase of the input signal with the phase of a feedback signal in order to provide an up-phase signal and a down-phase-signal, wherein the ratio of (i) a property of the up-phase signal; to (ii) a property of the down-phase-signal, is indicative of a phase difference between the input signal and the feedback signal;

an oscillator-driver configured to:
  apply an up-weighting-value to the up-phase signal in order to provide a weighted-up-phase signal;
  apply a down-weighting-value to the down-phase signal in order to provide a weighted-down-phase signal; and
  combine the weighted-up-phase signal with the weighted-down-phase signal in order to provide an oscillator-driver-output-signal;

a variable-frequency-oscillator configured to provide the feedback signal for the phase detector, wherein the variable-frequency-oscillator is configured to set the frequency of the feedback signal based on the oscillator-driver-output-signal;

a controller configured to:
  process an operating signal of the phase locked loop circuit to determine whether or not the input signal is in phase with the feedback signal, and
  if the input signal is in phase with the feedback signal, then set the up-weighting-value as the same value as the down-phase-weighting; and
  if the input signal is not in phase with the feedback signal, then set the up-weighting-value as a different value to the down-phase-weighting; and an output terminal configured to provide a local oscillator signal based on the feedback signal.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which:

FIG. 10 illustrates schematically a method of operating a PLL circuit.

Figure 1:
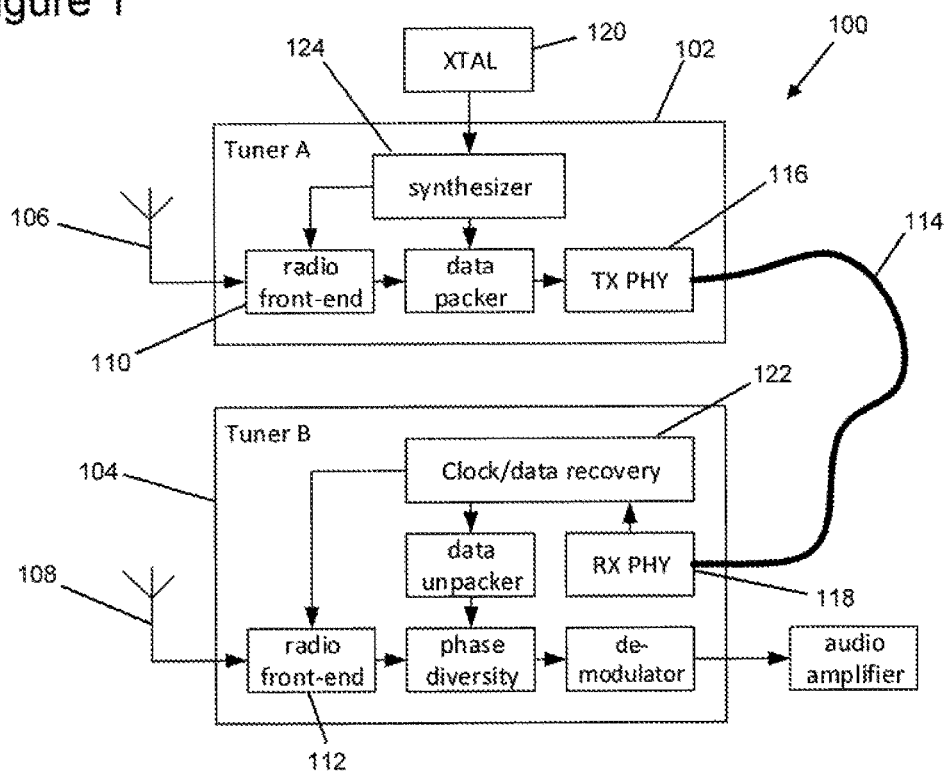
FIG. 1 shows an example embodiment of a distributed phase diversity system.

The performance of radio receivers may be reduced by the multipath reception phenomenon. This occurs when a transmitted signal reaches a receiver antenna by a direct path as well as indirect paths through reflections from objects. Depending on the delay between the direct and the reflected signals, they may add destructively and thereby interrupt normal operation of the receiver. This phenomenon can be observed in FM receivers of broadcast systems, where the wavelength of the radio signals and the distance to the surroundings (buildings, mountains, etc.) can make this undesired multipath effect very noticeable to a user.

In stationary situations, the position of the radio can be changed by just a few centimeters to ensure the antenna is at a location where the signals add constructively and the multipath distortion is avoided. In car radios, however, the antenna of the radio receiver will be subjected to continuously changing conditions and therefore multipath reception can be a major limitation in the quality of the received audio.

Car manufacturers can provide at least one additional antenna such that the two (or more) antennae will be separated by a distance that is about a quarter of the wavelength of the signals of interest. In this way, signals received by the two antennae are "uncorrelated" with respect to reflections—when one antenna is in a "signal dip" due to multipath interference, the other antenna should receive a strong signal. In order to reduce multipath distortion at the audio output, more advanced radio receivers can apply phase diversity algorithms that make use of these uncorrelated signals at multiple antennae, adjusting signal delays in the receiver system such that signal addition is constructive before demodulation. This can be achieved by providing separate tuners (radio front-ends) for each antenna and combining the signals digitally by a phase diversity algorithm prior to demodulation.

To achieve constructive addition of signals, various signal processing steps in the separated paths, prior to phase diversity operation, should make use of clock and timing references derived from a common crystal reference. Instead of a crystal reference, one could also use another frequency reference source, for example a MEMS resonator. This is to say that, for example, radio frequency (RF) mixers in each antenna path for converting signals to baseband should be driven by Local Oscillator (LO) signals from a common phase locked loop (PLL) and/or reference crystal oscillator to the PLL(s). Small, but constant, phase offsets can be corrected for by most phase diversity algorithms. However, even a small frequency offset, due to physically different crystals, can result in a continuously changing phase difference that cannot be distinguished from differences in time of arrival at the antennae by phase diversity algorithms. Therefore, it may not be possible to use separate crystals for each receiver because doing so could result in unacceptable frequency offset between the clocks.

FIG. 1 shows a distributed phase diversity system 100 that has two separate tuners: Tuner A 102 and Tuner B 104. Tuner A 102 receives signals from a first antenna 106 and has a first radio front end 110. Tuner B 102 receives signals from a second antenna 108 and has a second radio front end 112. The system of FIG. 1 also includes a serial data link 114 between Tuner A 102 and Tuner B 104, which can communicate a data signal from a transmitter-block 116 of Tuner A 102 to a receiver-block 118 of Tuner B 104.

A crystal 120 is shown associated with Tuner A 102. The crystal 120 provides a reference oscillator signal for Tuner A, which can be used to generate a clock signal for the radio front-end 110 of Tuner A (via a synthesizer 124 in this example). Tuner B is not directly linked to the crystal 120—for example it may be remote from the crystal 120 and Tuner A 102. Instead, a clock/data recovery block 122 is used to recover the clock signal from the data signal that is received from Tuner A 102 via the serial data link 114.

Local oscillator/clock signals in a radio system should have low phase noise for various reasons. For example, to reduce problems such as reciprocal mixing, where a strong undesired signal mixes with phase noise and makes reception of a small desired signal difficult or impossible, and also to ensure a good ultimate signal-to-noise ratio during FM reception. Frequency synthesizers having good phase noise performance are well-known, but they require a clean, single-frequency reference signal. Data signals for a distributed radio system, which are transferred via the serial data link 114, are quite the opposite; they are deliberately randomized to reduce or minimize interference. This results in a sin(x)/x-shaped, continuous spectrum from which the clock frequency and its harmonics are not immediately visible.

Figure 2:
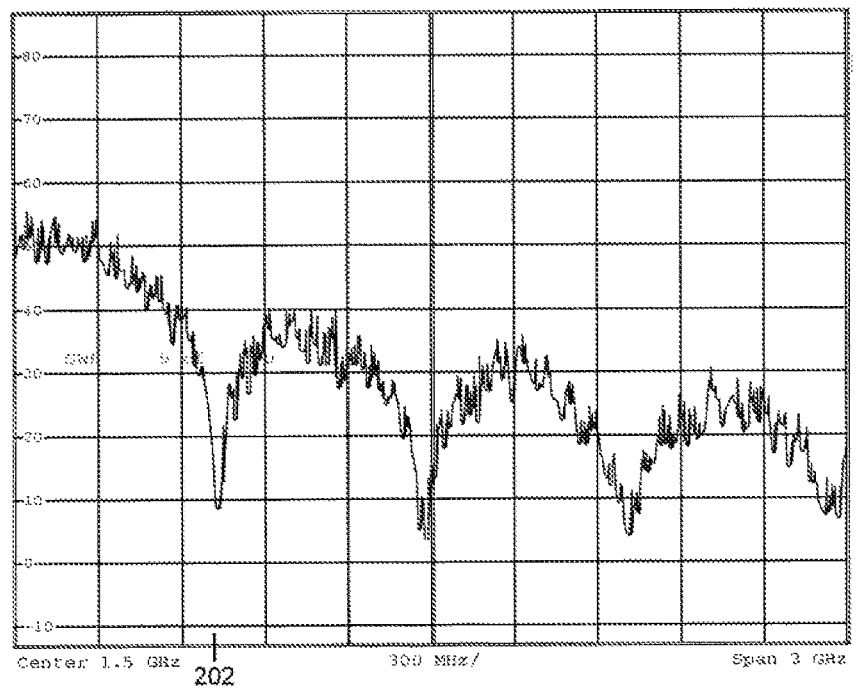
FIG. 2 shows an example of a measured spectrum of a data signal that is transferred via a serial data link in a distributed phase diversity system.

FIG. 2 shows an example of a measured spectrum of a data signal that is transferred via a serial data link in a distributed phase diversity system, such as the one illustrated in FIG. 1. Frequency is shown on the horizontal axis. Signal voltage in dBµV within the spectrum analyser's resolution bandwidth is shown on the vertical axis. The frequency of the clock signal is marked with reference 202 on the horizontal axis. FIG. 2 illustrates how the clock frequency (which is to be extracted) is completely absent from the noise spectrum of the data signal. Nonetheless, as will be described below, one or more of the circuits disclosed herein can successfully recover the clock signal from the data signal. In some applications, this can be considered better than using separate cabling to transfer the clock signal because reducing the amount of cabling can reduce costs, reduce weight and also reduce the amount of natural resources that is required to implement the system. Therefore, examples disclosed herein can use the data signal itself as the timing reference for all tuners that are not adjacent to a reference (crystal) oscillator.

Figure 3:
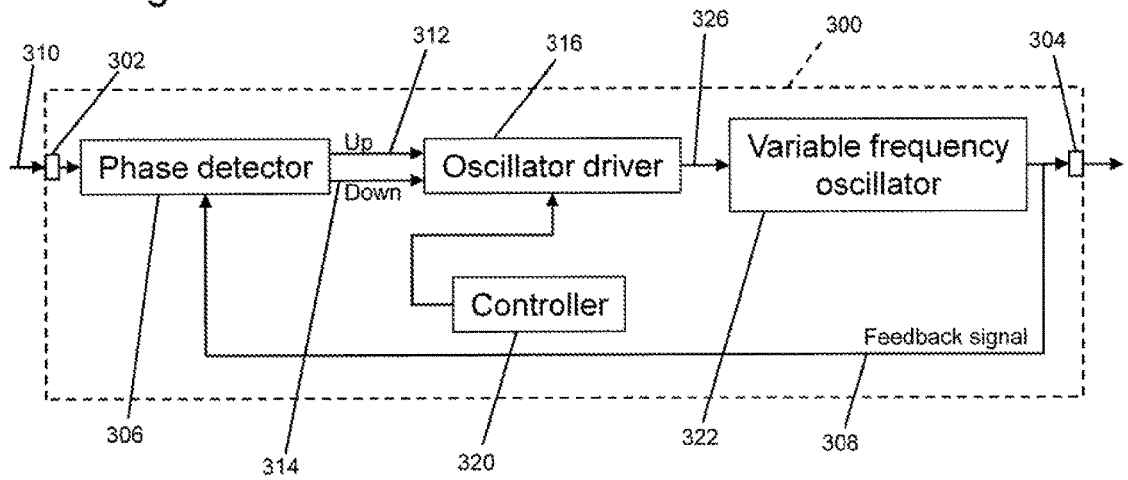
FIG. 3 illustrates an example embodiment of a phase locked loop (PLL) circuit.

FIG. 3 illustrates an example embodiment of a phase locked loop (PLL) circuit 300 that can be used in a clock/data recovery circuit, such as the one illustrated in FIG. 1. The PLL circuit 300 has an input terminal 302 that can receive an input signal 310. In this example the input signal 310 is a data signal from a different tuner, such as the one received via a serial data link in FIG. 1, and as illustrated in FIG. 2. An output terminal 304 is also shown that will provide a local oscillator output signal.

The PLL circuit 300 includes a phase detector 306 that compares the phase of the input signal 310 with the phase of a feedback signal 308 in order to provide an up-phase signal 312 and a down-phase-signal 314. In this way, when transitions occur in the input signal 310, the phase of the input signal 310 is compared with the phase of the feedback signal 308, and the up-phase signal 312 and down-phase-signal 314 are generated accordingly. As will be discussed below in detail with reference to FIGS. 4 and 5, a difference between (i) a property of the up-phase signal 312; and (ii) a property of the down-phase-signal 314 is indicative of a phase difference between the input signal 310 and the feedback signal 308. For the implementation of FIG. 4, the property is the duration of a pulse on-time in the respective signals. In some implementations, the difference can be represented as a ratio of (i) to (ii). For example, a ratio of 1:1 corresponds to a difference of 0. However, it will be appreciated that other implementations could provide the phase information by way of different types of up-phase signal 312 and down-phase signal 314. One example of which will be described below with reference to FIG. 9.

An oscillator-driver 316 is also shown in FIG. 3. The oscillator-driver 316 can apply an up-weighting-value to the up-phase signal 312 in order to provide a weighted-up-phase signal (not shown in FIG. 3) and apply a down-weighting-value to the down-phase signal 314 in order to provide a weighted-down-phase signal (not shown in FIG. 3). The oscillator-driver 316 can then combine the weighted-up-phase signal with the weighted-down-phase signal in order to provide an oscillator-driver-output-signal 326. As will be discussed below, a controller 320 can optionally be used to set the up-weighting-value and the down-weighting-value in accordance with whether or not the frequency of the feedback signal 308 is close enough to lock on to the input signal 310.

The variable-frequency-oscillator 322 provides the feedback signal 308 for the phase detector 306 by setting the frequency of the feedback signal 308 in accordance with the oscillator-driver-output-signal 326. The variable-frequency-oscillator 322 may be a voltage controlled oscillator (VCO). In this example the feedback signal 308 is also the local oscillator output signal that is provided to the output terminal 304. In other examples, further processing may be performed on the feedback signal 308 before it is provided to the output terminal 304.

The PLL circuit 300 also includes a controller 320. The controller 320 can process an operating signal of the PLL circuit 300 to determine whether or not the phase of the feedback signal 308 is in phase with the input signal 310. This can include determining if the phase of the feedback signal 308 is close enough to the phase of the input signal 310 for it to be locked on to by the PLL circuit 300, for example by comparing the operating signal to a threshold value. One specific implementation for making this determination, where the operating signal is a loop filter voltage, is described below with reference to FIG. 6. When the initial frequency error between the input signal 310 and the feedback signal 308 is greater than the bandwidth of the feedback loop of the PLL circuit 300, problems can arise when acquiring lock. The controller 320 of FIG. 3 can implement an acquisition aid when the initial controlled oscillator frequency is too far off.

If the phase of the input signal 310 is not close enough to the phase of the feedback signal 308, then the controller 320 sets the up-weighting-value as a different magnitude to the down-weighting-value. In this way, the controller 320 applies a dynamic offset between the up-phase-signal 312 and the down-phase-signal 314 when transitions occur in the input signal 310. This causes the variable frequency oscillator 322 to scan/sweep a range of frequencies such that it can get close enough to the desired clock frequency (as embedded in the input signal 310) to lock on to the clock frequency. This mode of operation may be referred to as a frequency-scanning-mode-of-operation.

Applying a weighting to achieve this functionality can be considered better than adding a fixed offset to the up-phase-signal 312 or the down-phase-signal 314. The PLL circuit 300 of FIG. 3 can operate satisfactorily hi the frequency-scanning-mode-of-operation when there is long delay between transitions in the input signal 310. This is because the offset is only applied when there are transitions in the data signal 310, and therefore there is meaningful information (as would be provided by transitions in the input signal 310) to apply the offset to. In contrast, a fixed offset could bring the circuit out of lock because the offset current may pull the loop out of lock when the data signal temporarily has only few transitions, during which time the oscillator driver 316 will be driven only by the fixed offset, and not by any information about the phase difference between the two signals.

If the controller 320 determines that the phase of the input signal 310 is close enough to that of the feedback signal 308, then optionally the controller 320 sets the up-weighting-value as the same magnitude as the down-weighting-value. That is, the controller 320 removes the dynamic offset such that the loop no longer scans a range of frequencies because of a difference in the weighting values. Instead, the loop refines the frequency of the feedback signal 308 based on the up-phase-signal 312 and the down-phase-signal 314 being equally-weighted (or unweighted). This mode of operation may be referred to as a locked-mode-of-operation. In other examples, the controller 320 can leave the weighting values as unequal values, on the basis that any static phase error that is introduced in the PLL is at an acceptably low level.

Figure 4:
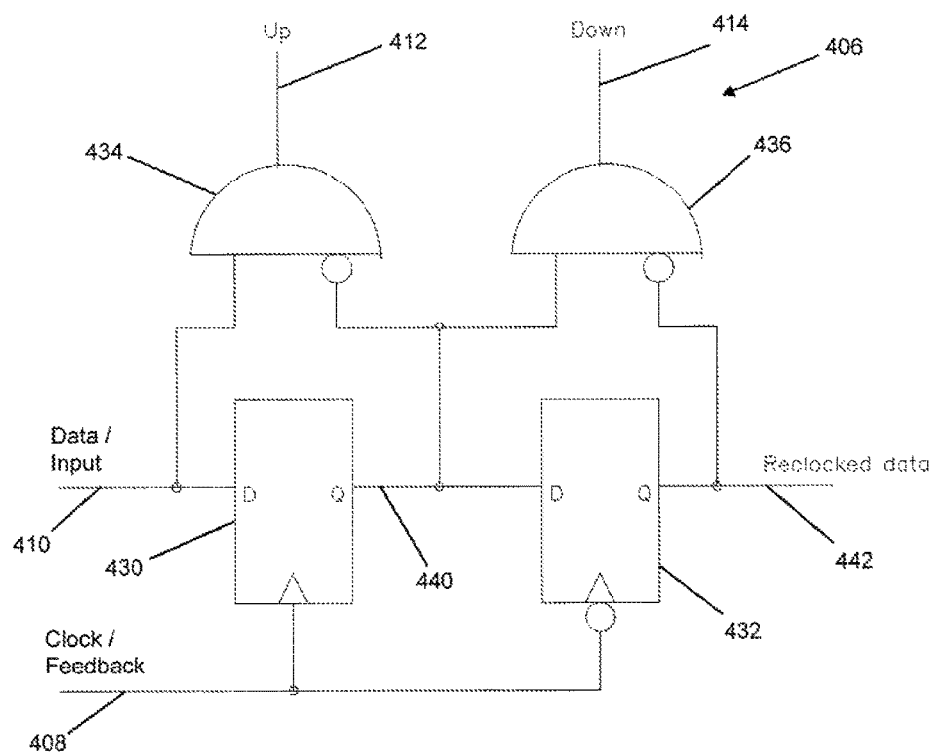
FIG. 4 shows an example implementation of the phase detector of FIG. 3.
Figure 5A:
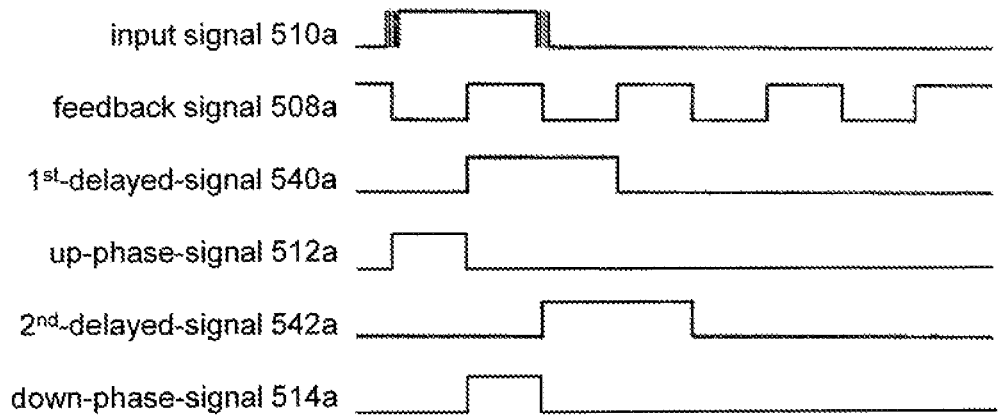
FIGS. 5a, 5b and 5c illustrate example waveforms of the phase detector of FIG. 4.
Figure 5B:
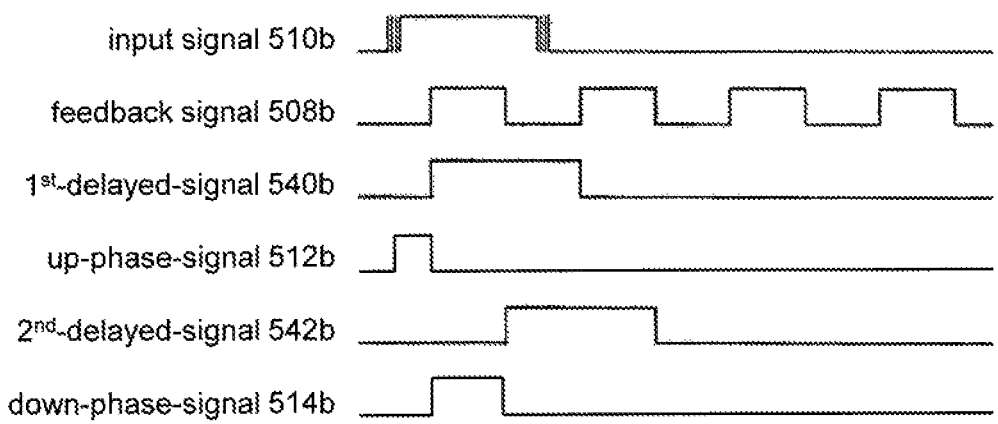
Figure 5C:
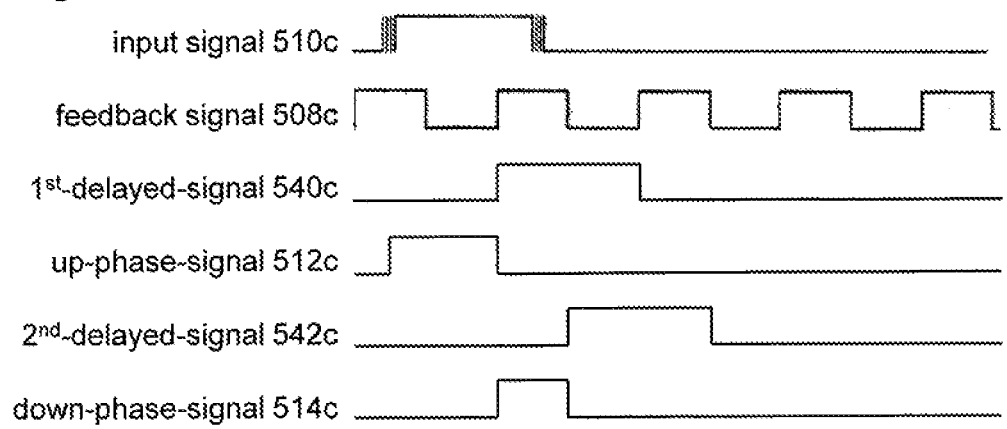

FIG. 4 shows an example implementation of the phase detector of FIG. 3. The phase detector 406 of FIG. 4 is based on a Hogge phase detector, and can be referred to as a modified Hogge detector. FIGS. 5a, 5b and 5c illustrate example waveforms of the phase detector:

FIG. 5a—where the feedback signal is in phase with the input signal;

FIG. 5b—where the feedback signal is out of phase with the input signal because the feedback signal is too early;

FIG. 5c—where the feedback signal is out of phase with the input signal because the feedback signal is too late.

Returning to FIG. 4, the data signal 410 corresponds to the input signal of FIG. 3 that is received from another tuner. The data signal 410 includes information about the clock signal that is to be recovered. The clock signal 408 corresponds to the feedback signal of FIG. 3, and represents the clock signal that has been recovered from the data signal 410 and fed back.

The phase detector 406 includes a first-D-type-flip-flop 430 and a second-D-type-flip-flop 432. In this example, the first-D-type-flip-flop 430 is rising-edge-sensitive, and the second-D-type-flip-flop 432 is falling-edge-sensitive. The data input of the first-D-type-flip-flop 430 receives the data signal 410 and the clock input of the first-D-type-flip-flop 430 receives the clock signal 408. The output of the first-D-type-flip-flop 430 provides a $1^{st}$-delayed-signal 440. The data input of the second-D-type-flip-flop 432 receives the $1^{st}$-delayed-signal 440 and the clock input of the second-D-type-flip-flop 432 receives the clock signal 408. The output of the second-D-type-flip-flop 432 provides a $2^{nd}$-delayed-signal 442. In this way, the first-D-type-flip-flop 430 is clocked by a first type of transition in the clock signal 408 (rising edge in this example) and the second-D-type-flip-flop 432 is clocked by a second (different) type of transition in the clock signal 408 (falling edge). This because the two flip flops are sensitive to different edges in the clock signal 408. In other examples, this types of edges that trigger each flip-flop can be reversed. As another example, the flip-flops can be triggered by the same type of edge, and the clock signal 408 can be inverted before it is provided to one of the flip-flops.

The phase detector 406 also includes a first-logic-gate 434 and a second-logic-gate 436. Each of these logic gates is an AND gate with an inverter at one of its inputs. The first-logic-gate 434 has a first input terminal that receives the data signal 410 and a second input terminal that receives the $1^{st}$-delayed-signal 440. The second-logic-gate 436 has a first input terminal that receives the $1^{st}$-delayed-signal 440 and a second input terminal that receives the $2^{nd}$-delayed-signal 442. In this example, the second input terminal of each logic gate has the inverter. In this way, each logic gate can be said to provide the functionality of half of an XOR gate. It will be appreciated that alternatively the first input terminal of each logic gate can have the inverter, whilst still providing the functionality of half of an XOR gate.

As shown in FIGS. 5a to 5c, by including the inverter at the second input terminal of each logic gate, the phase detector 406 responds to rising edges in the data signal 410. If the inverter were included at the first input terminal of each logic gate, the phase detector 406 would respond to falling edges in the data signal 410. In this example the phase detector 406 does not respond to both rising and falling edges in the data signal. This can be considered advantageous because any differences between a delay in the high-to-low and low-to-high transitions in the data signal 410 will not have an effect on the circuit. This is in contrast to a phase detector that responds to both rising and falling edges in the data signal, in which case such differences may cause jitter, or equivalently phase noise. This cause of phase noise can be eliminated or reduced by considering either only the rising edges, or only the falling edges of the data signal 410 as shown in FIG. 4.

As will be discussed with reference to FIGS. 5a to 5c, the duration/width of a pulse in the up-phase signal 412 represents a phase difference between the input signal 410 and the feedback signal 408. Also, the difference between (i) the duration of a pulse in the up-phase signal 412; to (ii) the duration of a pulse in the down-phase-signal 414, is indicative of a phase difference between the input signal 410 and the feedback signal 408. This difference may be represented as an absolute value, or as a ratio. Also, the duration of the pulse in the down-phase signal 414 is representative of the frequency of the feedback signal 408, irrespective of the phase difference between the input signal 410 and the feedback signal 408.

FIG. 5a shows example waveforms of the circuit of FIG. 4 when the feedback signal 508a is in phase with the input signal 510a, and the phase detector is balanced. Signals in each of FIGS. 5a to 5c have reference numbers in the 500 series that correspond to those of FIG. 4.

In FIG. 5a, a rising edge in the feedback signal 508a is in the centre of a bit interval of the input signal 510a. This results in the duration of the pulse/on-time in the up-phase signal 512a equalling the duration of the pulse/on-time in the down-phase signal 514a. Therefore, a ratio of 1:1 (difference of 0) for these durations is indicative of a zero phase difference between the two signals such that the frequency of the variable-frequency-oscillator does not require adjustment to change the phase difference between the two signals. Also, the duration of the pulse in the down-phase signal 514a is representative of the frequency of the feedback signal 508a, irrespective of the phase difference between the input signal 510a and the feedback signal 508a.

In FIG. 5b, a rising edge in the feedback signal 508b is before the centre of a bit interval of the input signal 510b. This results in the duration of the pulse in the up-phase signal 512b being less than the duration of the pulse in the down-phase signal 514b. Therefore, a ratio of less than 1:1 for these durations is indicative of a lagging phase difference between the two signals. Therefore, the frequency of the variable-frequency-oscillator should be decreased so that the phase difference between the two signals is reduced.

In FIG. 5c, a rising edge in the feedback signal 508c is after the centre of a bit interval of the input signal 510c. This results in the duration of the pulse in the up-phase signal 512c being greater than the duration of the pulse in the down-phase signal 514c. Therefore, a ratio of greater than 1:1 for these durations is indicative of a leading phase difference between the two signals. Therefore, the frequency of the variable-frequency-oscillator should be increased so that the phase difference between the two signals is reduced.

Figure 6:
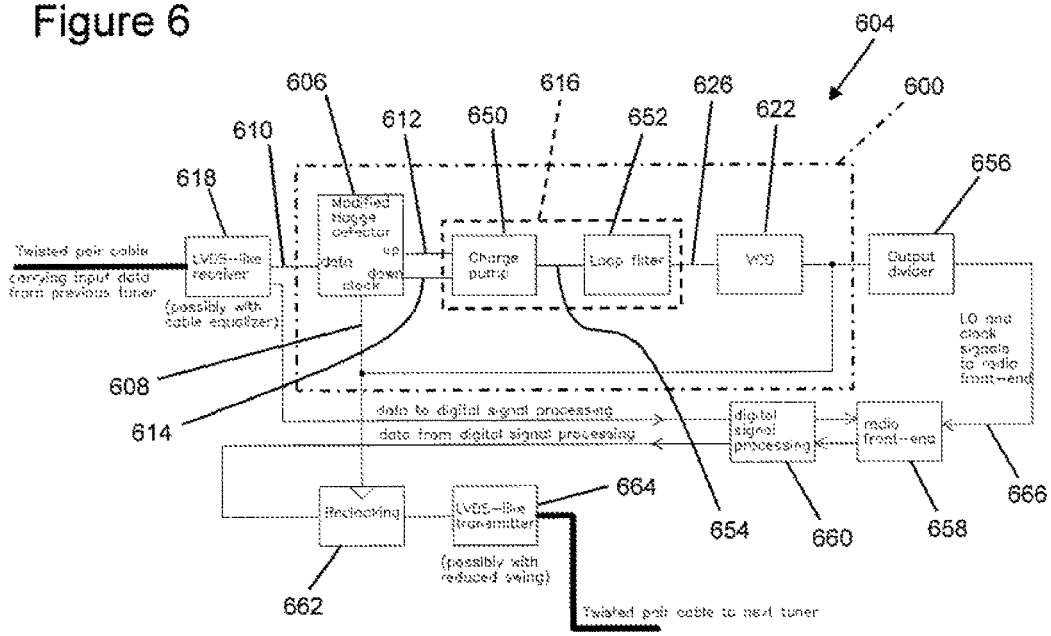
FIG. 6 shows an example embodiment of a tuner.

FIG. 6 shows an example embodiment of a tuner 604 that includes a PLL 600 such as the one of FIG. 3, and a phase detector 606 such as the one of FIG. 4.

The tuner 604 includes a receiver 618, in this example a LVDS-like receiver (low voltage differential signalling) for receiving an input data signal from a previous tuner over a twisted pair cable. Optionally, the receiver 618 includes a cable equalizer. The receiver 618 provides an input signal 610 to the data input of the phase detector 606, which in turn provides an up-phase-signal 612 and a down-phase-signal 614 to an oscillator driver 616. In this example, the oscillator driver 616 is provided by a charge pump 650 and a loop filter 652.

The charge pump 650 multiplies the up-phase signal 612 by an up-weighting-value in order to provide a weighted-up-phase signal (not shown), and multiplies the down-phase signal 614 by a down-weighting-value in order to provide a weighted-down-phase signal (not shown). As discussed above, the values of the weighting values are set by a controller (not shown), optionally in accordance with a mode of operation of the PLL circuit 600.

The charge pump 650 can then combine the weighted-up-phase signal with the weighted-down-phase signal to provide a combined-weighted-signal 654 by adding the two signals together. The combined-weighted-signal 654 is then low-pass filtered by a loop filter 652 in order to determine a time-averaged-weighted-signal which is used as the oscillator-driver-output-signal 626. The oscillator-driver-output-signal 626 is provided as a control signal to a variable frequency oscillator, which in this example is a VCO 622.

If the PLL circuit 600 is in a frequency-scanning-mode-of-operation, then the up-weighting-value is set as a different value to the down-weighting-value. In this example, the up-weighting-value is set as 150% of the down-weighting-value. This is implemented by the charge pump 650 having control bits that make the "up" current of the up-phase-signal 612 approximately 1.5 times larger than the "down" current of the down-phase-signal 614. Alternatively, the "down" current can be set as approximately 1.5 times larger than the "up" current. When one weighting-value is larger than the other, the oscillator-driver-output-signal 626 causes the frequency of the VCO 622 to either gradually increase or decrease. This is with a view to setting the frequency of the feedback signal 608 such that it has a phase that is close enough to that of the input signal 610 for the PLL circuit 600 to be able to bring the two signals into phase with equal weighting values.

With this method, when the input signal 610 temporarily has only few transitions, the acquisition aiding current is reduced proportionally because the modified Hogge detector 606 only activates the charge pump 650 after a rising data edge in the input signal 610. In this way the acquisition aid current is temporarily switched off (or reduced) when there are temporarily no (or too few) data transitions in the input signal 610. Hence, there is a reduced risk of the loop unintendedly getting pulled out of lock by the offset current.

In this example, the controller (not shown) can process the oscillator-driver-output-signal 626 (which is an example of a loop filter voltage) in order to determine whether or not the phase of the feedback signal 608 is close enough to that of the input signal 610. For example, the controller can compare the loop filter voltage with one or two threshold values, and when the loop filter voltage satisfies the threshold value(s) for a predetermined amount of time the controller can change the mode of operation to the locked-mode-of-operation. In the locked-mode-of-operation, the weighting values can be given the same values such that the dynamic offset is removed. In this way, after acquiring lock, the "up" and "down" currents can be set to nominally equal values. However, if a static phase error can be accepted, the "up" and "down" currents can also remain set at unequal values by unequal weighting values in the locked-mode-of-operation.

In some examples, the controller can apply an acquisition-aiding-algorithm when operating in the frequency-scanning-mode-of-operation. This algorithm can involve applying a first-set-of-unequal-weighting-values, and then subsequently applying a second-set-of-unequal-weighting-values. The first-set-of-unequal-weighting-values defines a first relative relationship between the up-weighting-value and the down-weighting-value (for example the up value is greater than the down value). The second-set-of-unequal-weighting-values defines a second, different relative relationship between the up-weighting-value and the down-weighting-value (for example the down value is greater than the up value). The controller can replace the first-set-of-unequal-weighting-values with the second-set-of-unequal-weighting-values if the loop filter voltage reaches a limit-value without satisfying the threshold. In this way, the controller first tries to acquire lock with the "up" current set larger than the down current (or vice versa). If this doesn't work, then the "down" current is made larger than the "up" current (or vice versa).

In an alternative example, the acquisition-aiding-algorithm can involve applying a first-set-of-unequal-weighting-values (with either one of the weighting values higher than the other), and then if the loop filter voltage reaches a limit-value without satisfying the threshold, the controller resets the loop filter (for example by activating a loop filter reset switch, or otherwise resetting the oscillator-driver-output-signal 626), and then a second-set-of-unequal-weighting-values is applied. In this example, the first-set-of-unequal-weighting-values and the second-set-of-unequal-weighting-values have the same relative relationship. Indeed, the first-set-of-unequal-weighting-values may be the same as the second-set-of-unequal-weighting-values. This causes the charge pump currents to be offset in only one direction, and can be considered as using a sawtooth waveform to scan the frequency range of the VCO 622 until it is close enough for the PLL circuit 600 to lock on to the input signal 610.

As discussed above, when the feedback signal 608 is in phase with the input signal 610, the duration of pulses in the up-phase signal 612 and the down-phase signal 614 are equal. The oscillator-driver-output-signal 626 then causes the VCO 622 to maintain a constant frequency of the feedback signal 608.

When the phase of the feedback signal 608 lags behind the input signal 610, the duration of pulses in the up-phase signal 612 are shorter than those in the down-phase signal 614. When the PLL 600 is in a locked-mode-of-operation (because the phase of the feedback signal 608 is considered close enough to the input signal 610 for it to be locked on), and the up-weighting-value is equal to the down-weighting-value, the oscillator-driver-output-signal 626 is representative of a pulse duration that is shorter than that of a pulse in the down-phase signal 614. This results in the VCO 622 being controlled such the frequency of the feedback signal 608 is decreased.

Similarly, when the phase of the feedback signal 608 leads that of the input signal 610, the duration of pulses in the up-phase signal 612 are longer than those in the down-phase signal 614. When the PLL 600 is in a locked-mode-of-operation, and the up-weighting-value is equal to the down-weighting-value, the oscillator-driver-output-signal 626 is representative of a pulse duration that is longer than that of a pulse in the down-phase signal 614. This results in the VCO 622 being controlled such the frequency of the feedback signal 608 is increased.

In the example of FIG. 6, the phase detector 606 compares the phase of a controlled oscillator (VCO 622) with a single type of edge (either rising or falling) of the incoming data signal 610 and generates correction signalling (the up-phase-signal 612 and the down-phase-signal 614). This correction signalling is filtered by a loop filter 652 and applied to a tuning input of the controlled oscillator (VCO 622).

Advantageously, the tuner 604 of FIG. 6 can be used for high-quality broadcast radio reception using a data signal 610 as the timing reference. The PLL circuit 600 can also be suitable for implementation on an integrated circuit (IC), at least in part because the loop bandwidth can be sufficiently high such that the loop filter 652 does not have to be too large—if the loop bandwidth is too small then the loop filter 652 would be too lame to include on an IC.

In this example, the tuner 604 also includes an output divider 656 that frequency divides the feedback signal 608 provided by the VCO 622 in order to provide a local oscillator signal 666. The local oscillator signal 666 is provided as a clock signal to a radio front end 658. The radio front end 658 also receives a received-digital-data-signal from the receiver 618, via a digital signal processor (DSP) 660. The radio front end 658 provides an output-digital-data-signal signal to a transmitter 664 via the DSP 660 and re-clocking-block 662. The transmitter 664 in this example is an LVDS-like transmitter, optionally with reduced swing, that provides an output data signal to a twisted pair cable to a subsequent tuner in the system. The re-clocking-block 662 is clocked by the feedback signal 608.

It will be appreciated that one or more of the analogue components disclosed herein can be replaced with digital equivalents. For example, the charge pump 650, loop filter 652 and VCO 622 can be replaced with a time-to-digital converter, a digital loop filter and a digitally controlled oscillator, respectively.

Figure 7:
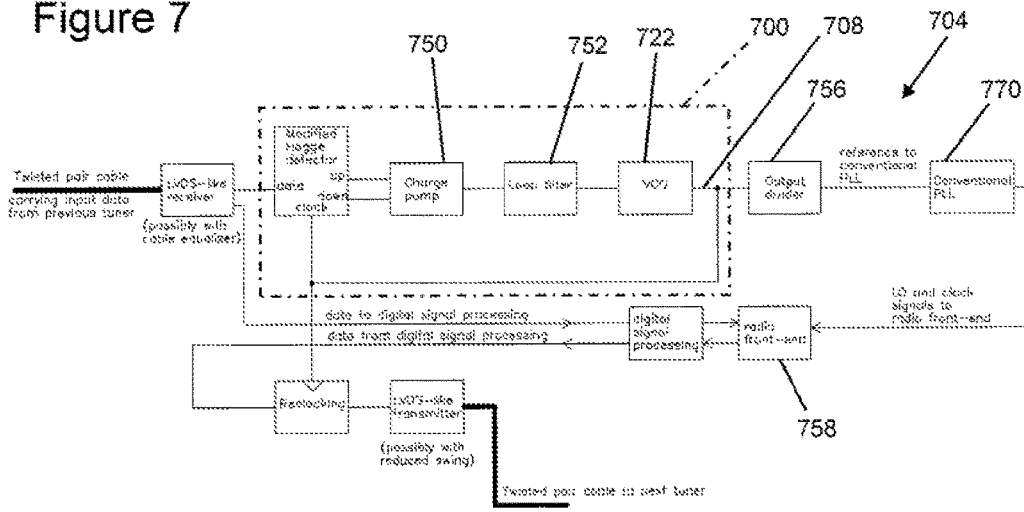
FIG. 7 shows another example embodiment of a tuner.

FIG. 7 shows another example embodiment of a tuner 704 that includes a PLL 700 such as the one of FIG. 3. Features of FIG. 7 that have already been described with reference to FIG. 6 will not necessarily be described again here.

In FIG. 7, the feedback signal 708 of the PLL 700 is provided to an optional output divider 756 in order to reduce the frequency of the feedback signal 708. The output of the output divider 756 is provided as an input to a second PLL 770, which can be any type of conventional PLL. In this way, the feedback signal 708 can be used (either directly or indirectly) as a reference to the second PLL 770.

The tuner 704 of FIG. 7 can be said to have a double phase-locked loop: a first PLL 700 that includes a modified Hogge detector, and a second PLL 770 that includes a conventional phase-frequency detector. The first PLL 700 can have a much larger bandwidth than the second PLL 770, and is used to provide a reference to the second PLL 770. The second PLL 770 generates the actual local oscillator signals for the radio front end 758 of the tuner 704.

The set-up of FIG. 7 can require a reduced overall loop filter area when compared with a tuner that uses only a PLL with a modified Hogge detector. That is, because the first. PLL 700 can have a larger bandwidth, the loop filter 752 can be made particularly small. This saving in chip area can be more than the extra chip area that is required to implement the second, additional, PLL 770. Also, the controlled oscillator 722 of the first PLL 700 can be provided as a cheap ring oscillator, rather than an expensive LC VCO, when it is used in combination with a first PLL 700 and a second PLL 770.

Further still, the set-up of FIG. 7 can provide more flexibility for frequency planning. This is because of the frequency ratios that the conventional PLL can synthesize. It can lock faster on a received data signal. This is because the bandwidth of the first PLL 700 can be large.

Figure 8:
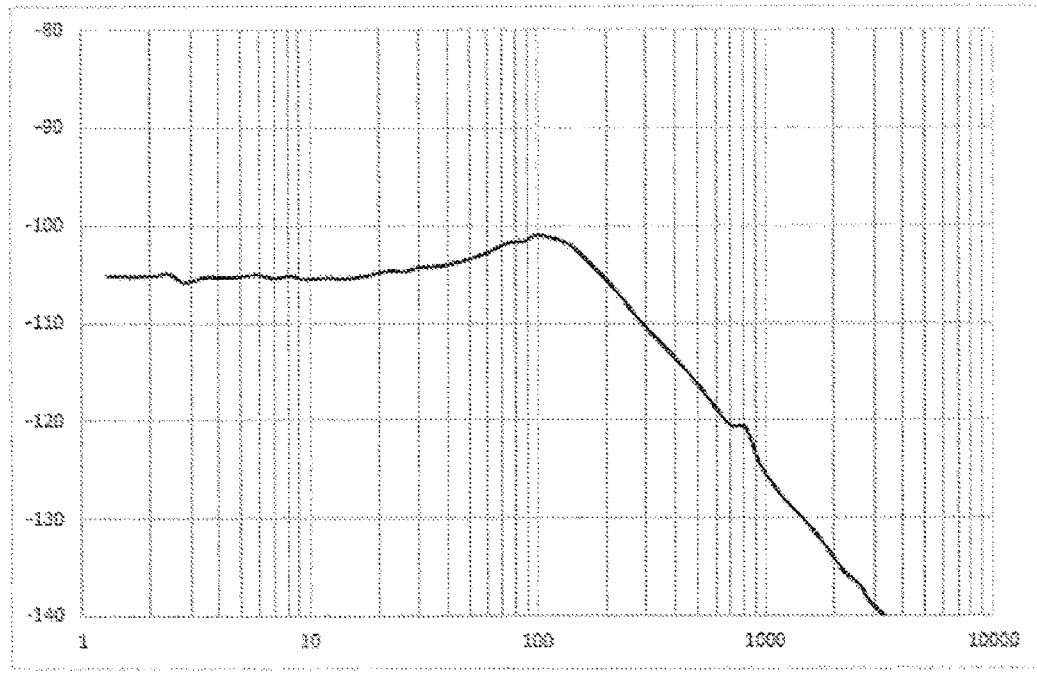
FIG. 8 shows a measured VCO frequency spectrum after a VCO has been locked on to a data stream using the tuner of FIG. 6.

FIG. 8 shows a measured VCO frequency spectrum after a VCO has been locked on to a data stream using the tuner of FIG. 6. Frequency offset from carrier, in kHz, is shown on the horizontal axis. Phase noise, in dBc/Hz, is shown on the vertical axis. FIG. 8 shows that the phase noise can be at an acceptable level for a car radio application, for a wide range of frequency offsets.

Figure 9:
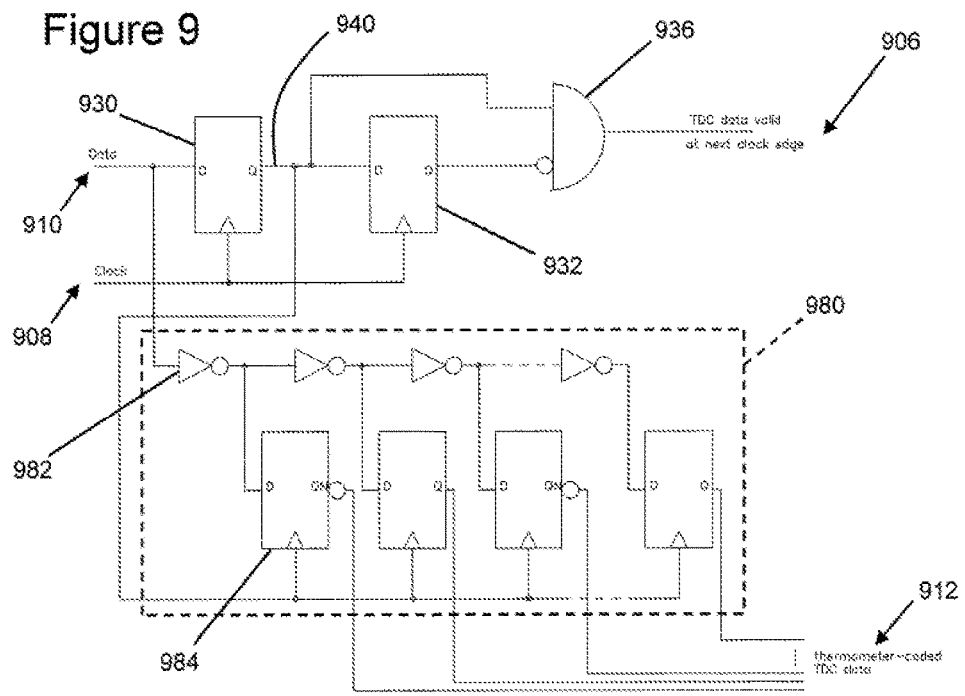
FIG. 9 illustrates another example implementation of a phase detector.

FIG. 9 illustrates another example implementation of a phase detector 906 that can be used with embodiments disclosed herein. The phase detector 906 is based on a time-to-digital converter (TQC) with modified Hogge functionality.

The phase detector 906 receives a data signal 910, which corresponds to the input signal of FIG. 3 that is received from another tuner. The data signal 910 includes information about the clock signal that is to be recovered. The phase detector 906 also receives a dock signal 908 that corresponds to the feedback signal of FIG. 3, and represents the clock signal that has been recovered from the data signal 910 and fed back.

The phase detector 906 provides an up-phase signal 912 as discussed below using a delay line. A down-phase-signal (not shown) can be implemented as a simple constant if static phase error is not critical, or if the delay line is suitably calibrated. Alternatively, the down-phase-signal could be generated with a normal TDC digitizing a complete clock period or a known fraction of a clock period.

The phase detector 906 of FIG. 9 sets a digital value of the up-phase signal, such that the difference between the digital value of the up-phase-signal 912 and a digital value of the down-phase-signal is indicative of a phase difference between the data signal 910 and the feedback signal 908. That is, the property of the up-phase signal 912 and the down-phase-signal that is indicative of a phase difference between the input signal and the feedback signal in this example is a digital value.

The phase detector 906 includes a conventional time-to-digital converter 980, which has a chain of TDC-inverters 982 and TDC-flip-flops 984. The TDC-inverters 982 are used as delay lines. The TDC-flip-flops 984 sample the outputs of the TDC-inverters 982 and thereby digitize the time difference between (i) a rising edge of the data signal 910 that is provided as an input to the first TDC-inverter 982, and (ii) the clock edge of the chain of TDC-flip-flops 984.

Two flip-flops 930, 932 and a logic gate 936 are also provided, which are connected together in the same way as the components with corresponding reference numbers in FIG. 4. The output of the first flip-flop 930 provides a 1st-delayed-signal 440, which is used as the clock input to the TDC-flip-flops 984. This can ensure that the time-to-digital converter 980 only works after a rising data edge in the data signal 910. Also, the output of the logic gate 936 provides a signal to indicate to a digital loop filter (not shown) that a new TDC value is available in the up-phase signal 912.

FIG. 10 shows schematically a method of operating a PLL circuit, such as the circuit of FIG. 3. The method comprises, at step 1002, receiving an input signal. At step 1004, the phase of the input signal with the phase of a feedback signal in order to provide an up-phase signal and a down-phase-signal. This comparison can be performed by a modified Hogge detector. The ratio of (i) a property of the up-phase signal; to (ii) a property of the down-phase-signal, is indicative of a phase difference between the input signal and the feedback signal.

At step 1006, the method involves applying an up-weighting-value to the up-phase signal in order to provide a weighted-up-phase signal, and at step 1008, a down-weighting-value is applied to the down-phase signal in order to provide a weighted-down-phase signal. These weighting values can be applied by a charge pump. At step 1010, the method combines the weighted-up-phase signal with the weighted-down-phase signal in order to provide an oscillator-driver-output-signal.

At step 1012, the method sets a frequency of a variable-frequency-oscillator based on the oscillator-driver-output-signal. The variable-frequency-oscillator provides the feedback signal that is used at step 1004.

At step 1014, the method processes an operating signal (such as a loop filter voltage) of the phase locked loop circuit to determine whether or not the input signal is in phase with the feedback signal. If the input signal is in phase with the feedback signal, then the method sets the up-weighting-value as the same value as the down-phase-weighting at step 1016. If the input signal is not in phase with the feedback signal, then the method sets the up-weighting-value as a different value to the down-phase-weighting at step 1018.

At step 1020, the method provides a local oscillator signal based on the feedback signal. The local oscillator signal can be used as a clock/reference signal for demodulating signals received at a radio tuner associated with the PLL circuit.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or to multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services.

As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A phase locked loop circuit comprising:
   an input terminal configured to receive an input signal;
   a phase detector configured to compare a phase of the input signal with a phase of a feedback signal in order to provide an up-phase signal and a down-phase-signal, wherein a difference between a property of the up-phase signal and a property of the down-phase-signal, is indicative of a phase difference between the input signal and the feedback signal;
   an oscillator-driver configured to apply an up-weighting-value to the up-phase signal in order to provide a weighted-up-phase signal apply a down-weighting-value to the down-phase signal in order to provide a weighted-down-phase signal, and combine the weighted-up-phase signal with the weighted-down-phase signal in order to provide an oscillator-driver-output-signal;
   a variable-frequency-oscillator configured to provide the feedback signal for the phase detector, wherein the variable-frequency-oscillator is configured to set a frequency of the feedback signal based on the oscillator-driver-output-signal;
   a controller configured to set the up-weighting-value and the down-weighting-value as a first-set-of-weighting-values, compare a loop filter voltage to a limit-value, and replace the first-set-of-weighting-values with a second-set-of-weighting-values after the loop filter voltage reaches the limit-value without satisfying a threshold value; and
   an output terminal configured to provide a local oscillator signal based on the feedback signal.

2. The phase locked loop circuit of claim 1, wherein the controller is configured to process an operating signal of the phase locked loop circuit to determine whether or not the input signal is in phase with the feedback signal, and, after the input signal is in phase with the feedback signal, set the up-weighting-value as the same value as the down-weighting-value.

3. The phase locked loop circuit of claim 1, wherein the oscillator-driver is configured to multiply the up-phase signal by the up-weighting-value in order to provide the weighted-up-phase signal, and multiply the down-phase signal by the down-weighting-value in order to provide the weighted-down-phase signal.

4. The phase locked loop circuit of claim 1, wherein following a transition in the input signal, the phase detector is configured to compare the phase of the input signal with the phase of the feedback signal in order to provide the up-phase signal and down-phase-signal.

5. The phase locked loop circuit of claim 4, wherein the phase detector is configured to compare the phase of the input signal with the phase of the feedback signal following only a rising-edge transition or only a falling-edge transition in the input signal.

6. The phase locked loop circuit of claim 1, wherein the phase detector is configured to provide a pulse in the up-phase-signal in response to a transition in the input signal.

7. The phase locked loop circuit of claim 6, wherein the phase detector is configured to provide a pulse in the down-phase-signal after the pulse in the up-phase-signal.

8. The phase locked loop circuit of claim 7, wherein the difference between the duration of the pulse in the up-phase signal and the duration of the pulse in the down-phase-signal, is indicative of a phase difference between the input signal and the feedback signal.

9. The phase locked loop circuit of claim 7, wherein the duration of one of the pulses in the up-phase signal and the down-phase-signal is indicative of a clock frequency.

10. The phase locked loop circuit of claim 7, wherein the phase detector is configured to set the duration of the pulse in the up-phase signal as equal to the duration of the pulse in the down-phase-signal when the input signal is in phase with the feedback signal.

11. The phase locked loop circuit of claim 1, wherein the oscillator-driver is configured to determine an average value of the weighted-up-phase signal and the weighted-down-phase signal in order to provide the oscillator-driver-output-signal.

12. The phase locked loop circuit of claim 1, wherein the first-set-of-weighting-values defines a first relative relationship between the up-weighting-value and the down-weighting-value, and the second-set-of-weighting-values defines a second, different relative relationship between the up-weighting-value and the down-weighting-value.

13. The phase locked loop circuit of claim 1, wherein the first-set-of-weighting-values defines a first relative relationship between the up-weighting-value and the down-weighting-value, the second-set-of-weighting-values defines the same relative relationship between the up-weighting-value and the down-weighting-value, and the controller is configured to reset the oscillator-driver-output-signal before replacing the first-set-of-weighting-values with the second-set-of-weighting-values.

14. A radio tuner comprising a clock recovery circuit, wherein the clock recovery circuit includes the phase locked loop circuit of claim 1.

15. A method of operating a phase locked loop circuit, the phase locked loop comprising a variable-frequency-oscillator, wherein the method comprises:
   receiving an input signal;
   comparing a phase of the input signal with a phase of a feedback signal in order to provide an up-phase signal and a down-phase-signal, wherein a difference between a property of the up-phase signal and a property of the down-phase-signal is indicative of a phase difference between the input signal and the feedback signal;
   applying an up-weighting-value to the up-phase signal in order to provide a weighted-up-phase signal;

applying a down-weighting-value to the down-phase signal in order to provide a weighted-down-phase signal; and combining the weighted-up-phase signal with the weighted-down-phase signal in order to provide an oscillator-driver-output-signal;

setting a frequency of a variable-frequency-oscillator based on the oscillator-driver-output-signal, wherein the variable-frequency-oscillator provides the feedback signal;

setting the up-weighting-value and the down-weighting-value as a first-set-of-weighting-values, comparing a loop filter voltage to a limit-value;

replacing the first-set-of-weighting-values with a second-set-of-weighting-values after the loop filter voltage reaches the limit-value without satisfying a threshold value; and providing a local oscillator signal based on the feedback signal.

16. The phase locked loop circuit of claim 1, wherein the controller is configured to process an operating signal of the phase locked loop circuit to determine whether or not the input signal is in phase with the feedback signal, and, after the input signal is not in phase with the feedback signal, set the up-weighting-value as a different value to the down-weighting-value.

\* \* \* \* \*